(12) United States Patent
Zhou et al.

(10) Patent No.: US 9,721,649 B1
(45) Date of Patent: Aug. 1, 2017

(54) CIRCUIT FOR AND METHOD OF IMPLEMENTING A WRITE OPERATION OF A MEMORY

(71) Applicant: Xilinx, Inc., San Jose, CA (US)

(72) Inventors: Shidong Zhou, Milpitas, CA (US); Jing Jing Chen, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/237,395

(22) Filed: Aug. 15, 2016

(51) Int. Cl.
G11C 7/00 (2006.01)
G11C 11/419 (2006.01)

(52) U.S. Cl.
CPC .................. G11C 11/419 (2013.01)

(58) Field of Classification Search
CPC ........ G11C 7/1051; G11C 7/22; G11C 7/1078
USPC .......... 365/189, 5, 189.11, 154, 206
See application file for complete search history.

(56) References Cited

U.S. PATENT DOCUMENTS

| | | |
|---|---|---|
| 5,450,022 A | 9/1995 | New |
| 5,523,971 A | 6/1996 | Rao |
| 5,844,844 A | 12/1998 | Bauer et al. |
| 6,057,704 A | 5/2000 | New et al. |
| 6,396,303 B1 | 5/2002 | Young |
| 6,529,041 B1 | 3/2003 | Ng et al. |
| 6,664,807 B1 | 12/2003 | Crotty et al. |
| 6,768,338 B1 | 7/2004 | Young et al. |
| 6,903,571 B1 | 6/2005 | Trimberger |
| 7,023,744 B1 | 4/2006 | Shimanek et al. |
| 7,053,652 B1 | 5/2006 | de Jong |
| 7,053,654 B1 | 5/2006 | Young et al. |
| 7,109,751 B1 | 9/2006 | de Jong |
| 7,236,000 B1 | 6/2007 | Steiner |
| 7,298,168 B1 | 11/2007 | Steiner |
| 7,408,827 B1* | 8/2008 | Peng ........................ G11C 7/08 365/154 |
| 7,451,423 B1 | 11/2008 | Reynolds et al. |
| 7,451,425 B1 | 11/2008 | Reynolds et al. |
| 7,584,448 B1 | 9/2009 | Reynolds et al. |
| 7,912,693 B1 | 3/2011 | Han et al. |
| 8,713,409 B1 | 4/2014 | Tseng et al. |
| 2012/0212996 A1* | 8/2012 | Rao ........................ G11C 11/419 365/154 |

* cited by examiner

*Primary Examiner* — Son Dinh
(74) *Attorney, Agent, or Firm* — John J. King

(57) ABSTRACT

A circuit for implementing a write operation of a memory is described. The circuit comprises a data line buffer coupled to a data line and an inverted data line for writing data; a plurality of memory elements, each memory element having a first node coupled to the data line and a second node coupled to the inverted data line; and a write assist circuit having a first node coupled to data line and a second node coupled to the inverted data line, wherein the write assist circuit comprises a pair of pull-down transistors comprising first pull-down transistor coupled to the first node of an amplifier portion and a second pull-down transistor coupled to a second node of the amplifier portion, and a pair of pull-up transistors comprising a first pull-up transistor coupled to the first node of the amplifier portion and a second pull-up transistor coupled to the second node of the amplifier portion. A method of implementing a write operation of a memory of a memory is also described.

20 Claims, 7 Drawing Sheets

US 9,721,649 B1

CIRCUIT FOR AND METHOD OF IMPLEMENTING A WRITE OPERATION OF A MEMORY

FIELD OF THE INVENTION

The present invention relates generally to integrated circuit devices, and in particular, to a circuit for and a method of improving a write operation of a memory.

BACKGROUND OF THE INVENTION

Memory is an important part of many integrated circuit devices. Some integrated circuit devices such as programmable logic devices (PLDs) have programmable resources. These programmable resources are customized by loading a configuration bitstream, typically from off-chip memory, into configuration memory cells. The functionality of the integrated circuit device is controlled by configuration data bits of a configuration bitstream provided to the integrated circuit device for that purpose. However, writing data to configuration memory can pose challenges. For example, a ground voltage associated with memory cells of the integrated circuit device may have higher voltages at cold temperatures, making it difficult to write data to the cell.

Accordingly, circuits and methods that improve the performance of memory access circuits in integrated circuits are beneficial.

SUMMARY OF THE INVENTION

A circuit for implementing a write operation of a memory is described. The circuit comprises a data line buffer coupled to a data line and an inverted data line for writing data; a plurality of memory elements, each memory element having a first node coupled to the data line and a second node coupled to the inverted data line; and a write assist circuit having a first node of an amplifier portion coupled to data line and a second node of the amplifier portion coupled to the inverted data line, wherein the write assist circuit comprises a pair of pull-down transistors comprising first pull-down transistor coupled to the first node of an amplifier portion and a second pull-down transistor coupled to a second node of the amplifier portion, and a pair of pull-up transistors comprising a first pull-up transistor coupled to the first node of the amplifier portion and a second pull-up transistor coupled to the second node of the amplifier portion.

Another circuit for implementing a write operation of a memory comprises a data line buffer coupled to a data line and an inverted data line for writing data; a plurality of memory elements, each memory element having a first node coupled to the data line and a second node coupled to the inverted data line; and a write assist circuit having a first node coupled to data line and a second node coupled to the inverted data line, wherein the write assist circuit comprises a voltage source transistor configured to provide a reference voltage to the amplifier portion of the write assist circuit in response to a control signal.

A method of implementing a write operation of a memory is also described The method comprises enabling the writing of data on a data line and an inverted data line; coupling, for each memory element a plurality of memory elements, a first node to the data line and a second node to the inverted data line; and coupling a first node of an amplifier portion of a write assist circuit to the data line and a second node of the write assist circuit to the inverted data line, wherein the write assist circuit comprises a pair of pull-down transistors comprising first pull-down transistor coupled to the first node of the amplifier portion and a second pull-down transistor coupled to the second node of the amplifier portion, and a pair of pull-up transistors comprising a first pull-up transistor coupled to the first node of the amplifier portion and a second pull-up transistor coupled to the second node of the amplifier portion.

Other features will be recognized from consideration of the Detailed Description and the Claims, which follow.

DETAILED DESCRIPTION

While the specification includes claims defining the features of one or more implementations of the invention that are regarded as novel, it is believed that the circuits and methods will be better understood from a consideration of the description in conjunction with the drawings. While various circuits and methods are disclosed, it is to be understood that the circuits and methods are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the circuits and methods.

The circuits and methods provide improved writing to memory cells by implementing write assist circuits at various locations of a memory, such as at predetermined locations in columns of memory elements of a memory. The write assist circuits are placed on the data bus lines, and operate as amplifiers for signals on the data and inverted data bus lines. More particularly, the write assist circuits are configured to enhance the logic zero side of the write operation, particularly at cold temperatures. According to one implementation of the circuits and methods, the write assist circuits comprise a pair of pull-up transistors including a first pull-up transistor coupled to a data bus line and a second pull-up transistor coupled to an inverted data bus line. According to another implementation of the circuits and methods, a voltage source transistor is configured to provide power to an amplifier circuit of the write assist circuit in response to a control signal. The circuits and methods find particular application in configuration memory cells associated with PLDs, for example, but can be implemented to improve memory storage in any type memory device having a plurality of memory cells driven by the same write control circuit.

Figure 1:
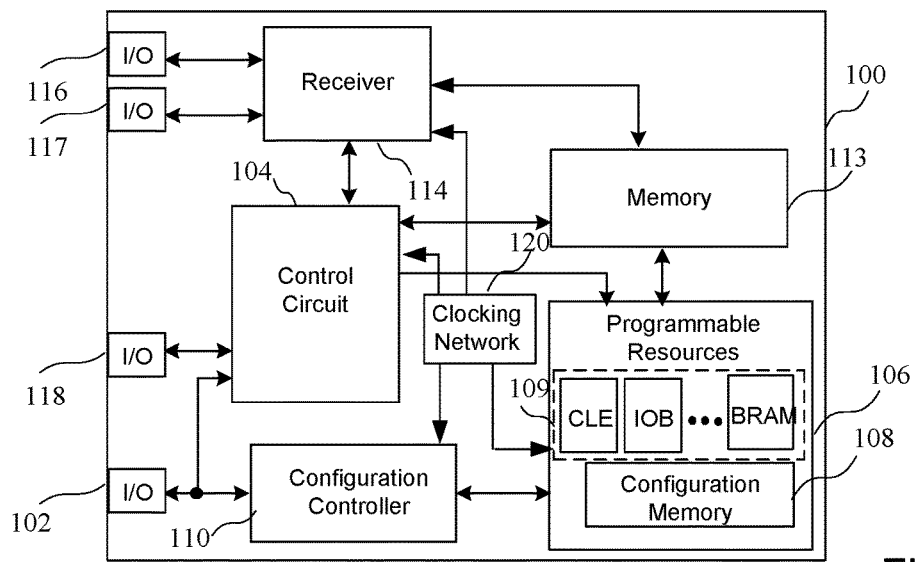
FIG. 1 is a block diagram of an integrated circuit comprising memory elements included in the integrated circuit.

Turning first to FIG. 1, a block diagram of an integrated circuit 100 comprising a circuit for receiving data in the integrated circuit is shown. In particular, an input/output port 102 is coupled to a control circuit 104 that controls programmable resources 106 having configurable logic elements 109. Configuration data may be provided to the configuration memory 108 by a configuration controller 110. The configuration data enables the operation of the programmable resources 106. A memory 113 may be coupled to the control circuit 104 and the programmable resources 106. A receiver circuit 114 may be coupled to the control circuit 104, programmable resources 106 and the memory 113, and may receive signals at the integrated circuit by way of I/O ports 116 and 117. Other I/O ports may be coupled to circuits of the integrated circuit device, such as I/O port 118 that is coupled to the control circuit 104 as shown. A clocking network 120 is coupled to various elements of the circuit of FIG. 1. The circuits and methods as described in more detail below could be implemented to improve the write operation of the configuration memory of FIG. 1, for example.

Figure 2:
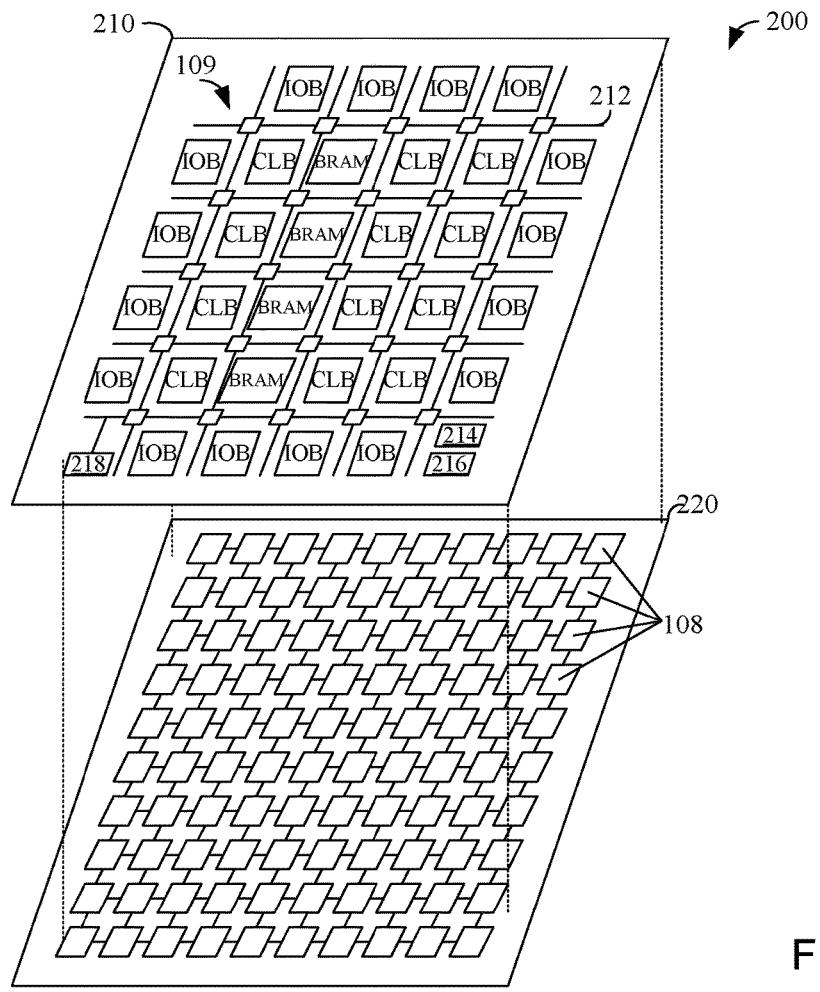
FIG. 2 is a diagram showing an arrangement of configuration memory and programmable resources of an integrated circuit device.

Turning now to FIG. 2, a diagram shows the arrangement of configuration memory and programmable resources of an integrated circuit, such as a PLD 200 for example. The PLD of FIG. 2 is conceptually divided into a programmable logic plane 210, which contains the programmable resources 109, as will be described in more detail below in reference to FIGS. 9-11, and a configuration plane 220. In an actual PLD, the configuration memory cells and programmable resources are interspersed on the integrated circuit. Each programmable resource in programmable logic plane 210 is configured by one or more associated configuration memory cells on configuration plane 220, which comprises the configuration memory 108. Configuration memory cells can be configured using one or more configuration ports, such as configuration port 214 and configuration access port 216. In PLD 200, configuration memory cells can also be configured using an internal configuration access port 218. Internal configuration access port 218 is coupled to programmable interconnect 212 so configured logic circuits, such as a processing core, can configure configuration memory cells through internal configuration access port 218. In some implementations, a single dual-ported configuration access port may be used in place of internal configuration access port 218 and configuration access port 216.

Depending on the specific architecture of the PLD, different protocols are used to configure the configuration memory cells. For example, the configuration memory cells are accessed using a frame based protocol. The set of configuration memory cells associated with a configurable logic block or input/output block is accessed as a major frame. Within the major frame, minor frames control the configuration memory cells of each programmable element of the configuration logic block or input/output block. When configuring a configurable logic block or an input/output block, an entire major frame is generally written to the configuration memory cells. To use the configuration memory cells in a read/write manner, the processing core can first read the frame from the configuration memory cells, modify the appropriate bits as necessary, and then write back the modified frame.

Figure 3:
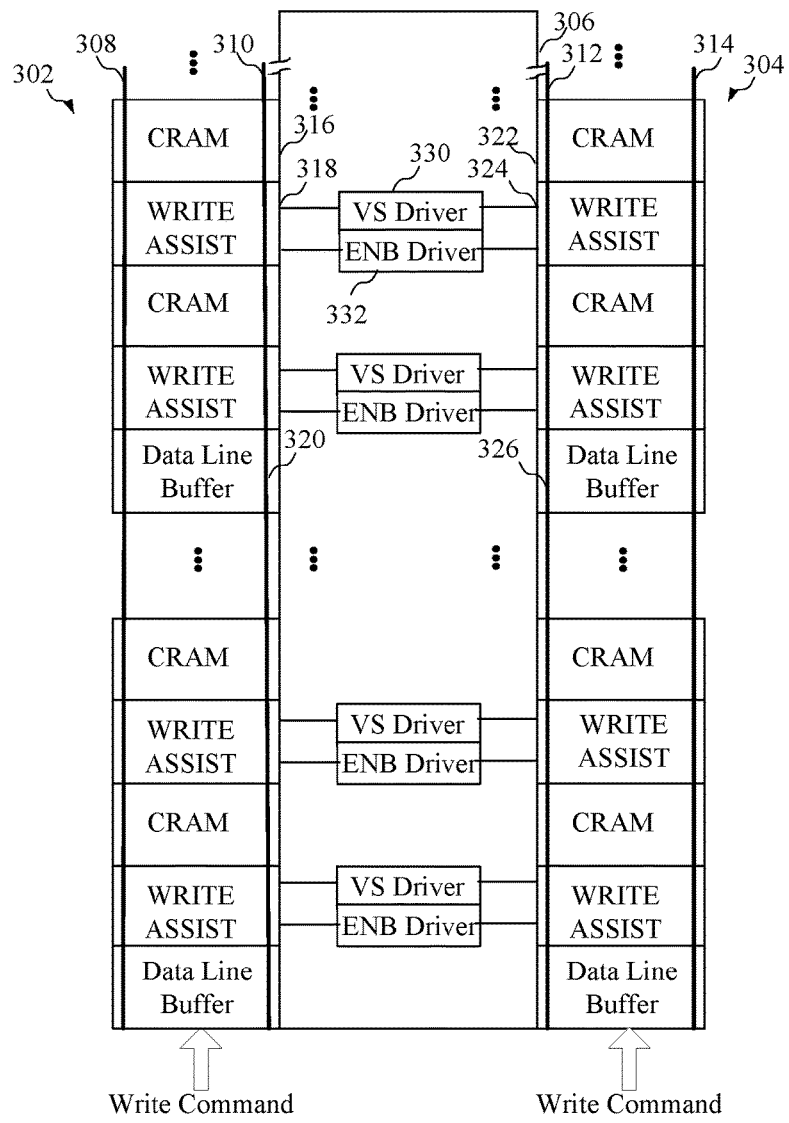
FIG. 3 is a block diagram of an arrangement of elements enabling the writing of data to configuration memory elements in an integrated circuit device.

Turning now to FIG. 3, a block diagram of an arrangement of configuration memory elements in an integrated circuit device is shown. As shown in FIG. 3, a first column 302 and a second column 304 of elements enabling writing data to configuration memory are provided on either sides of a column 306 having circuits generating control signals. The first column 302 comprises a data line 308 and an inverted data line 310, while the second column 304 comprises a data line 312 and an inverted data line 314. Each of the columns comprises a plurality of circuit elements that enable the writing of configuration data. More particularly, the first column 302 comprises a plurality of configuration random access memory (CRAM) elements 316 each associated with a corresponding write assist circuit 318 as shown. A data line buffer 320 is associated with a number of CRAM elements. Similarly, the second column 304 comprises a plurality of CRAM elements 322 each associated with a corresponding write assist circuit 324 as shown. The second column also comprises the data line 312 and the inverted data line 314. A data line buffer 320 is associated with a number of CRAM elements. By way of example, a data line buffer 320 could be implemented with approximately 10 write assist circuits. However, the number of write assist circuits and corresponding CRAM elements that are associated with a data line buffer may vary depending upon the type of circuits that are programmed using configuration data stored in the CRAM elements. For example, when implementing configurable logic blocks (CLBs) or interconnect (INT) elements, which are generally smaller than a digital signal processor (DSP) element for example, up to 13 write assist circuits can be implemented between 2 data line buffers.

The column 306 of circuits generating control signals comprises driver circuits, including a voltage signal (VS) driver 330 and an enable (ENB) driver 332. A VS driver and an ENB driver provide VS and ENB signals respectively to the write assist circuits, which will be described in more detail below. The VS driver and ENB driver provide the VS and ENB signals to the write assist circuits on either side of the column 306. While a single column of circuits enabling writing configuration data to CRAM elements is shown on either side of the column 306, it should be understood that many columns could be provided on either side of the column 306. For example, one thousand columns of memory elements could be provided on each side of a column 306, where the VS and ENB drivers provide the VS and ENB control signals to all of the write assist circuits in the row of write assist circuits. The operation of the write assist circuit 318 will be described in more detail in reference to FIG. 5.

Figure 4:
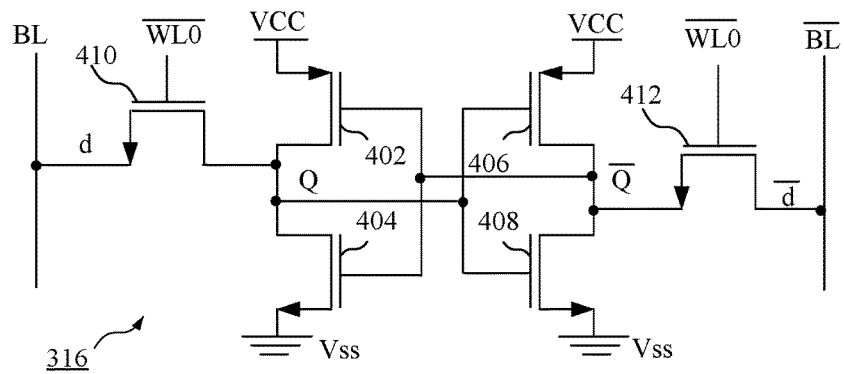
FIG. 4 is a block diagram of a configuration random access memory (CRAM) element of FIG. 3 implemented as a static random access memory (SRAM)

Turning now to FIG. 4, a circuit diagram of an SRAM memory cell implemented as a CRAM of FIG. 3 is shown. The memory cell includes an inverter having a p-channel transistor 402 with a source coupled to a reference power voltage, such as VDD, and a drain coupled at a first node "Q" to a drain of an n-channel transistor 404, the source of which is coupled to a ground potential (VSS). The memory cell includes a second inverter having a p-channel transistor 406 with a source coupled to the reference voltage and a drain coupled at a second node "Q_b" to a drain of an n-channel transistor 408, the source of which is also coupled to ground. The first node "Q" is controlled by an n-channel transistor 410 coupled to receive an inverted word line (WL0_bar) signal at its gate which controls the receipt of input data on a bit line (BL), also known as a data line, at the first node. The second node "Q_b" is controlled by another n-channel transistor 412 coupled to receive the inverted word line signal at its gate which controls the receipt of inverted input data at the second node Q_b. When an inverted word line (WL0_bar) is selected for a given cell, the values on the bit line and inverted bit line are coupled to the Q and Q_b nodes, where the data value for the cell is stored. While the memory cell of FIG. 4 is shown by way of example, other memory cells could be employed.

Figure 5:
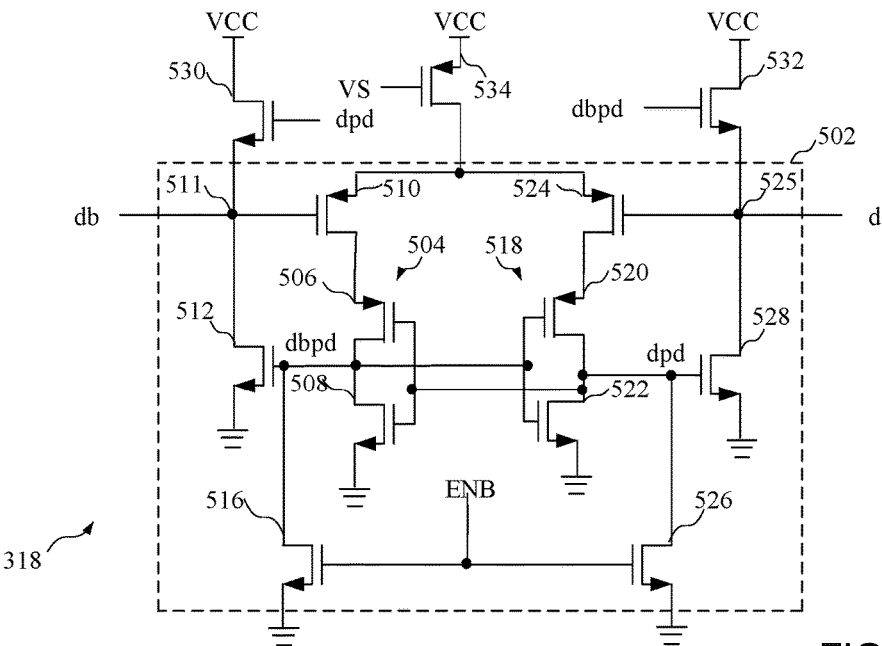
FIG. 5 is a block diagram of a write assist circuit of the arrangement of elements of FIG. 3.

Turning now to FIG. 5, a block diagram of a write assist circuit of the arrangement of elements of FIG. 3 is shown. More particularly, an amplifier portion 502 of the write assist circuit comprises a first NAND gate 504 having a first PMOS transistor 506 coupled in series with a second NMOS transistor 508, wherein the gate of the transistor 506 is coupled to the gate of the transistor 508. A PMOS control transistor 510 has a source that is configured to receive a reference voltage and a drain coupled to the source of transistor 506. A gate of the transistor 510 is coupled to the data bus at a node 511. An NMOS transistor 512 is coupled between the node 511 and ground, and has a gate configured to receive the inverted data pull-down signal (dbpd) generated at a first pull-down node at the output of the NAND gate 504. An enable (ENB) signal is coupled to a gate of a control transistor 516. The control transistor 516 enables pulling the inverted data pull down signal (dbpd) at the gate of the transistor 512 to ground.

The amplifier portion 502 also comprises a second NAND gate 518 having a first PMOS transistor 520 coupled in series with a second PMOS transistor 522, wherein the gate of the transistor 520 is coupled to the gate of the transistor 522. A PMOS control transistor 524 has a source that is configured to receive a reference voltage and a drain coupled to the source of transistor 520. A gate of the transistor 524 is coupled to the data line at a node 525. An NMOS transistor 528 is coupled between the node 525 and ground and has a gate coupled to the data pull-down signal (dpd) generated at the output of the NAND gate 518. The enable (ENB) signal is also coupled to a gate of a control transistor 526. The control transistor 526 enables pulling the data pull-down signal (dpd) at the gate of the transistor 528 to ground.

Additional transistors are implemented to improve the performance of amplifier portion 502. An NMOS transistor 530 is coupled between the reference voltage VCC and the node 511, while an NMOS transistor 532 is coupled between VCC and the node 525. The transistors 530 and 532 operate as pull-up transistors for pulling a node 511 or 525 high when writing a logical one to the data line or the inverted data line of a CRAM element. More particularly, when the data pull-down signal (dpd) signal is high, the node 525 coupled to the data line is pulled low, and the inverted data pull-down signal (dbpd) at the output of the NAND gate 504 is low. The high dpd signal at the gate of the transistor 530 also turns on transistor 530 to pull the node 511 high (to VCC minus the threshold voltage Vt of transistor 530), and a high dbpd signal at the gate of transistor 532 also turns on the transistor 532 to pull node 525 high. While the pull-down transistors 516 and 528 ensure that the node 511 or 525 is pulled low when a logical zero is on either the data line or the inverted data line, the pull-up transistors 530 and 532 ensure that the node 511 or 525 is pulled high when a logical one is on either the data line or the inverted data line. That is, the use of both pull-down and pull-up transistors improves the write margin for the memory elements by ensuring that the data line and inverted data lines are pulled as high as possible or as close to ground as possible.

A PMOS transistor 534 is coupled between VCC and the sources of the transistors 510 and 524 and operates as a voltage source transistor to pull the sources of the transistors 510 and 524 high in response to a voltage signal (VS), which operates as a control signal. That is, rather than having a control signal pull the sources of the transistors 510 and 524 high, the transistor 534 is coupled between the reference voltage VCC and the sources of transistors 510 and 524, and provides the reference voltage VCC to the sources of the transistors 510 and 524 in response to a control signal. The use of the transistor 534 provides a more reliable voltage source at the sources of the transistors 510 and 524, rather than relying upon a control signal, such as control signal VS coupled to the sources of the transistors 510 and 524.

Figure 6:
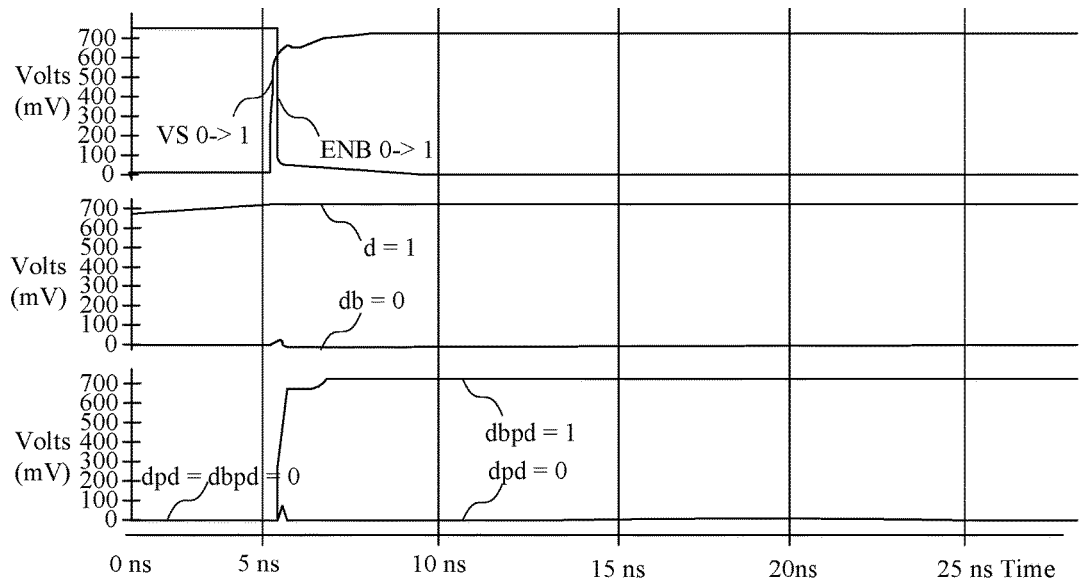
FIG. 6 is a timing diagram showing the operation of the write assist circuit of FIG. 5.

In operation, the desired configuration values are driven on the data line and the inverted data line, such as d=1 and db=0. When the enable signal (ENB) is pulled high and the control signal VS is pulled low, transistors 516 and 526 are turned on to drive the pull-down signals dpd and dbpd low. When the control signal VS is driven high, transistors 510 and 506 are turned on, and the dbpd node at the gate of the transistor 512 is pulled high. Because transistor 524 is off, the dpd node at the gate of the transistor 528 remains low. When ENB is pulled low, latch flips, where the dbpd node voltage is pulled high and the dpd voltage is pulled low, turning transistor 512 on and transistor 528 off, enabling db=0 and d=1 as shown in FIG. 6.

Figure 7:
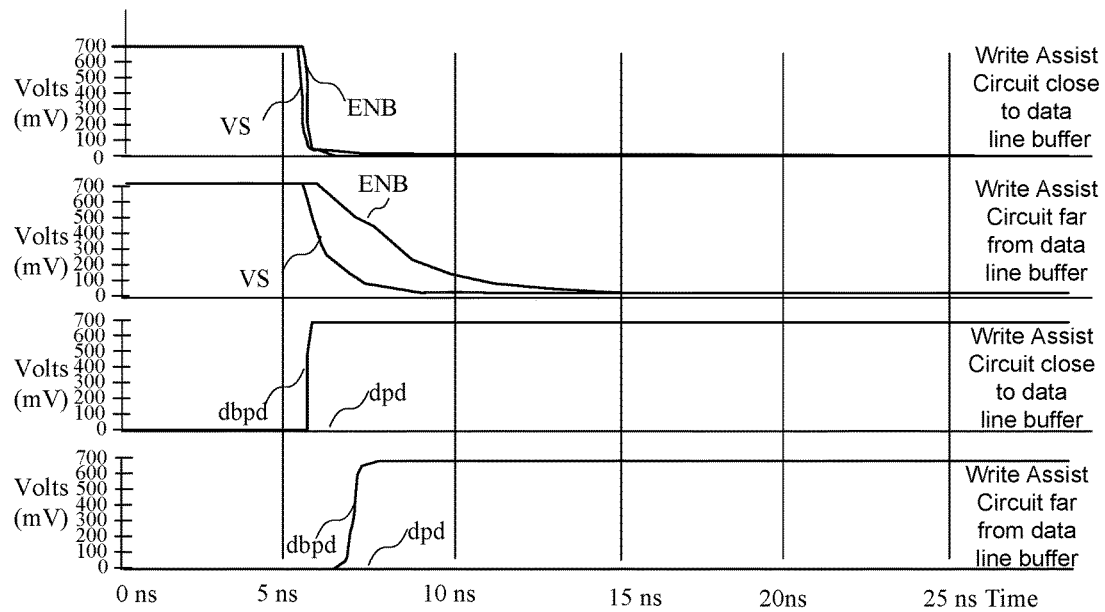
FIG. 7 is a timing diagram showing the operation of the write assist circuit of FIG. 3 with pull-up and voltage control transistors.
Figure 8:
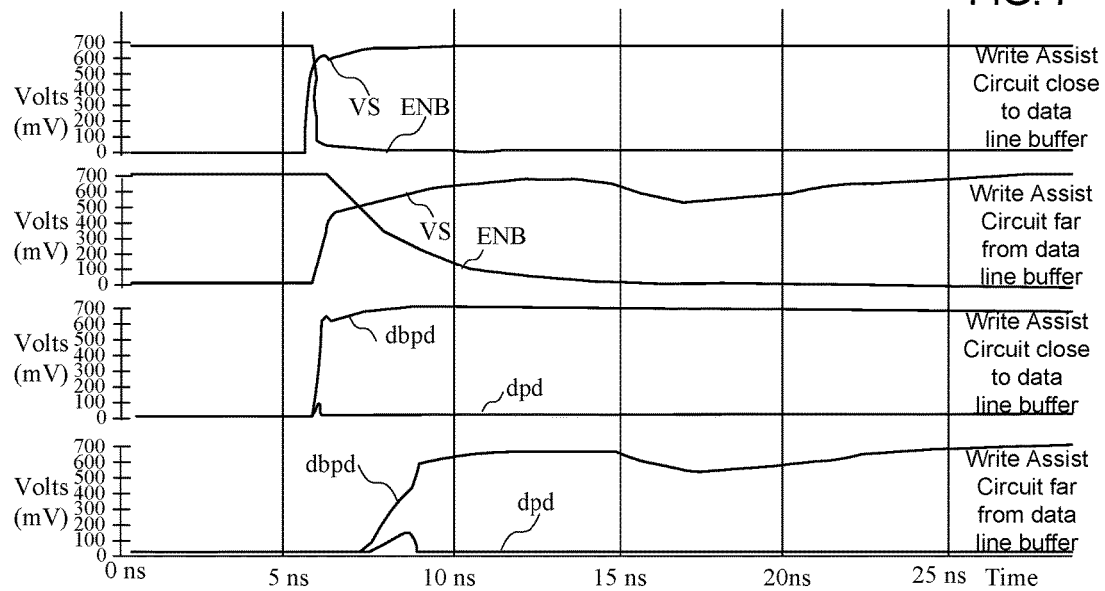
FIG. 8 is a timing diagram showing the operation of the write assist circuit of FIG. 3 without pull-up and voltage control transistors.

As shown in FIGS. 7 and 8, timing diagrams show an operation of a memory of FIG. 3 with and without a feedback buffer. As can be seen in FIG. 8, the VS and dbpd signals are similar for write assist circuits near the the data line buffer and far away from the data line buffer. However, the VS voltage at the sources of transistors 510 and 524 (i.e. when VS is directly applied to the sources of the transistors 510 and 524) and the voltage at the dbpd node in write assist circuits far from the data line buffer are low (i.e. not near the 700 mV values of the corresponding signals when the pull-up transistors 530-532 and the control transistor 534 are used). As is shown in FIG. 7, the VS signal and the dbpd signal are closer to a maximum or minimum voltage for write assist circuits far from the data line buffer, compared to the VS signal and the dbpd signal for write assist circuits far from the data line buffer, but which do not implement transistors 530-534 as shown in FIG. 8.

Figure 9:
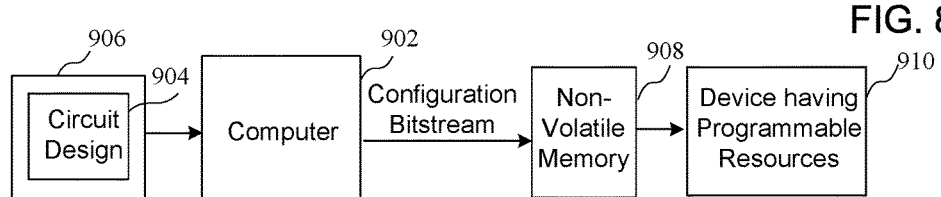
FIG. 9 is a block diagram of a system for programming a device having programmable resources.

Turning now to FIG. 9, a block diagram of a system for programming a device having programmable resources according to an embodiment is shown. In particular, a computer 902 is coupled to receive a circuit design 904 from a memory 906, and generates a configuration bitstream that is stored in the non-volatile memory 906. As will be described in more detail below, the circuit design may be a high level design, such as a circuit design defined in a hardware description language (HDL). Also, the computer may be configured to run software that generates a configuration bitstream that is stored in the non-volatile memory 908 and provided to an integrated circuit 910 that may be a programmable integrated circuit, such as the integrated circuit described below in FIG. 10. As will be described in more detail below, bits of the configuration bitstream are used to configure programmable resources of the integrated circuit.

Figure 10:
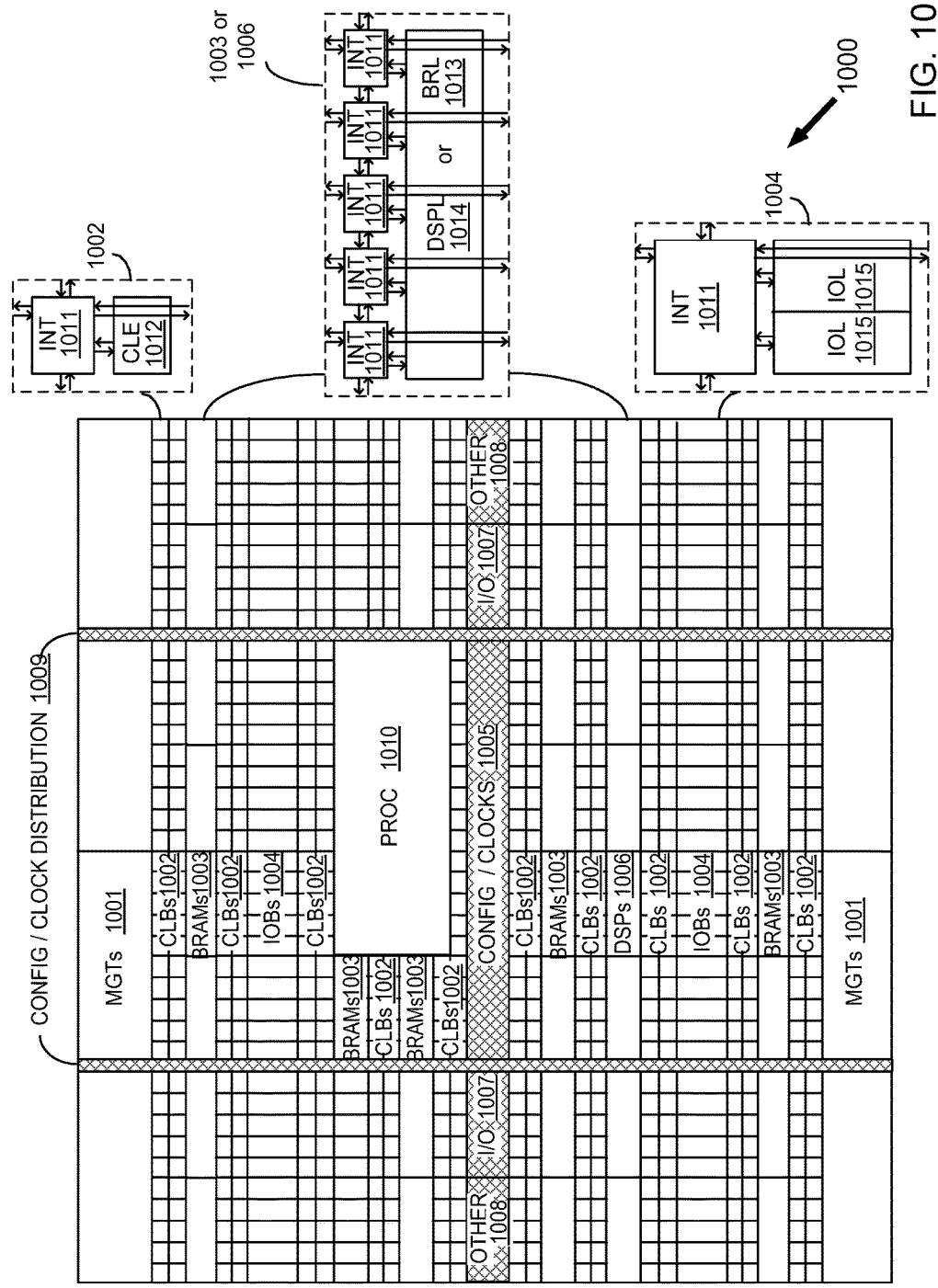
FIG. 10 is a block diagram of a device having programmable resources.

Turning now to FIG. 10, a block diagram of a device having programmable resources including the circuits of FIGS. 1-8 is shown. While devices having programmable resources may be implemented in any type of integrated circuit device, such as an application specific integrated circuit (ASIC) having programmable resources, other devices comprise dedicated programmable logic devices (PLDs). One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., Flash memory, as in some CPLDs), or in any other type of memory cell.

The device of FIG. 10 comprises an FPGA architecture 1000 having a large number of different programmable tiles including multi-gigabit transceivers (MGTs) 1001, CLBs 1002, random access memory blocks (BRAMs) 1003, input/output blocks (IOBs) 1004, configuration and clocking logic (CONFIG/CLOCKS) 1005, digital signal processing blocks (DSPs) 1006, specialized input/output blocks (I/O) 1007 (e.g., configuration ports and clock ports), and other programmable logic 1008 such as digital clock managers, analog-to-digital converters, system monitoring logic, and so forth. Some FPGAs also include dedicated processor blocks (PROC) 1010, which may be used to implement a software application, for example.

In some FPGAs, each programmable tile includes a programmable interconnect element (INT) 1011 having standardized connections to and from a corresponding interconnect element in each adjacent tile. Therefore, the programmable interconnect elements taken together implement the programmable interconnect structure for the illustrated FPGA. The programmable interconnect element 1011 also includes the connections to and from the programmable logic element within the same tile, as shown by the examples included at the top of FIG. 10.

For example, a CLB 1002 may include a configurable logic element (CLE) 1012 that may be programmed to implement user logic plus a single programmable interconnect element 1011. A BRAM 1003 may include a BRAM logic element (BRL) 1013 in addition to one or more programmable interconnect elements. The BRAM includes dedicated memory separate from the distributed RAM of a configuration logic block. Typically, the number of interconnect elements included in a tile depends on the height of the tile. In the pictured embodiment, a BRAM tile has the same height as five CLBs, but other numbers may also be used. A DSP tile 1006 may include a DSP logic element (DSPL) 1014 in addition to an appropriate number of programmable interconnect elements. An 10B 1004 may include, for example, two instances of an input/output logic element (IOL) 1015 in addition to one instance of the programmable interconnect element 1011. The location of connections of the device is controlled by configuration data bits of a configuration bitstream provided to the device for that purpose. The programmable interconnects, in response to bits of a configuration bitstream, enable connections comprising interconnect lines to be used to couple the various signals to the circuits implemented in programmable logic, or other circuits such as BRAMs or the processor.

In the pictured embodiment, a columnar area near the center of the die is used for configuration, clock, and other control logic. The config/clock distribution regions 809 extending from this column are used to distribute the clocks and configuration signals across the breadth of the FPGA. Some FPGAs utilizing the architecture illustrated in FIG. 10 include additional logic blocks that disrupt the regular columnar structure making up a large part of the FPGA. The additional logic blocks may be programmable blocks and/or dedicated logic. For example, the processor block PROC 1010 shown in FIG. 10 spans several columns of CLBs and BRAMs.

Note that FIG. 10 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 10 are purely exemplary. For example, in an actual FPGA more than one adjacent column of CLBs is typically included wherever the CLBs appear in order to facilitate the efficient implementation of user logic. While the embodiment of FIG. 10 relates to an integrated circuit having programmable resources, it should be understood that the circuits and methods set forth in more detail below could be implemented in any type of ASIC.

Figure 11:
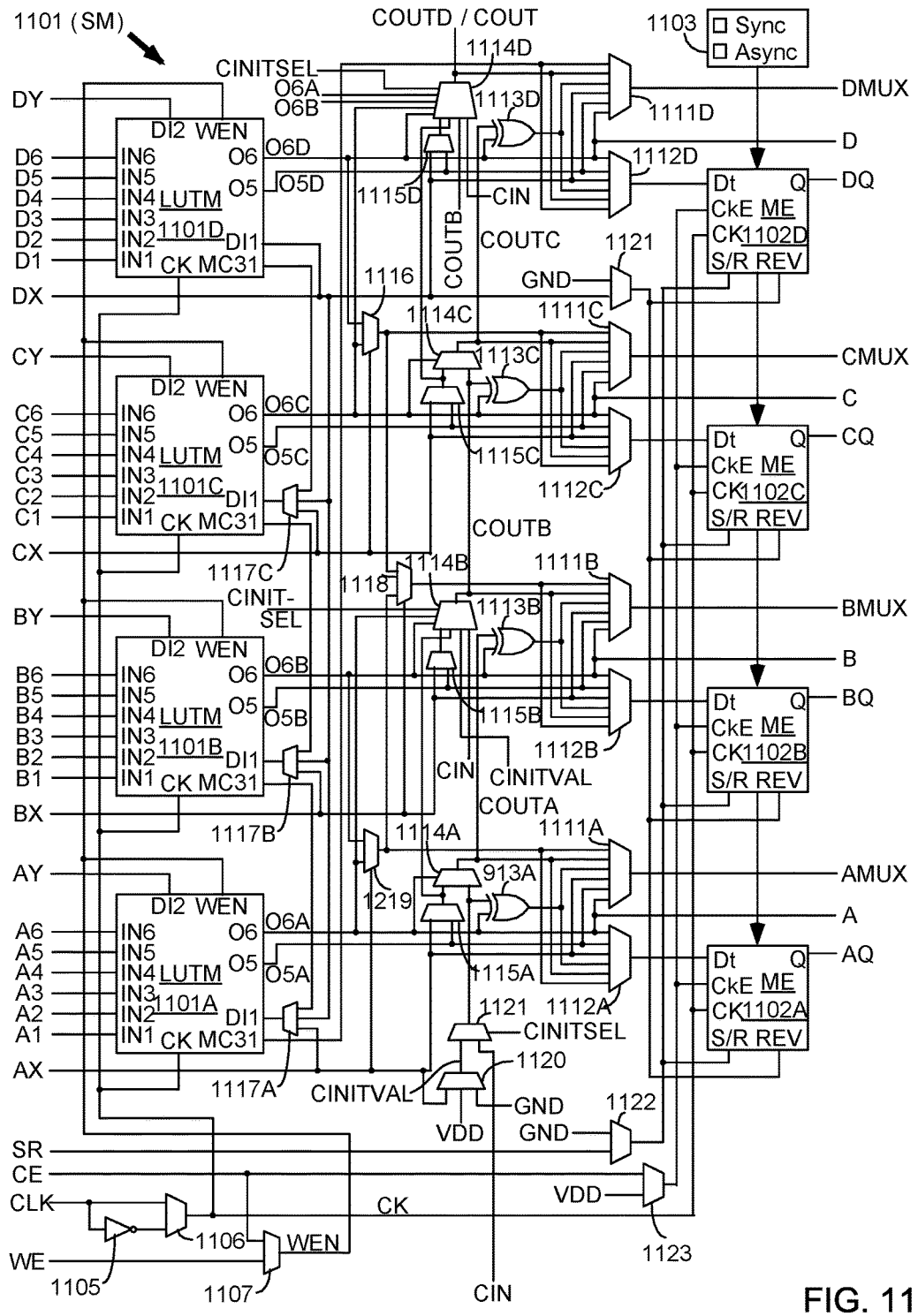
FIG. 11 is a block diagram of a configurable logic element of the device of FIG. 10.

Turning now to FIG. 11, block diagram of a configurable logic element of the device of FIG. 10 is shown. In particular, FIG. 11 illustrates in simplified form a configurable logic element of a configuration logic block 1002 of FIG. 10. In the embodiment of FIG. 11, slice M 1101 includes four lookup tables (LUTMs) 1101A-1101D, each driven by six LUT data input terminals A1-A6, B1-B6, C1-C6, and D1-D6 and each providing two LUT output signals O5 and O6. The O6 output terminals from LUTs 1101A-11401D drive slice output terminals A-D, respectively. The LUT data input signals are supplied by the FPGA interconnect structure via input multiplexers, which may be implemented by programmable interconnect element 1111, and the LUT output signals are also supplied to the interconnect structure. Slice M also includes: output select multiplexers 1111A-1111D driving output terminals AMUX-DMUX; multiplexers 1112A-1112D driving the data input terminals of memory elements 1102A-1102D; combinational multiplexers 1116, 1118, and 1119; bounce multiplexer circuits 1122-1123; a circuit represented by inverter 1105 and multiplexer 1106 (which together provide an optional inversion on the input clock path); and carry logic having multiplexers 1114A-1114D, 1115A-1115D, 1120-1121 and exclusive OR gates 1113A-1113D. All of these elements are coupled together as shown in FIG. 11. Where select inputs are not shown for the multiplexers illustrated in FIG. 11, the select inputs are controlled by configuration memory cells. That is, configuration bits of the configuration bitstream stored in configuration memory cells are coupled to the select inputs of the multiplexers to select the correct inputs to the multiplexers.

These configuration memory cells, which are well known, are omitted from FIG. 11 for clarity, as well as from other selected figures herein.

In the pictured embodiment, each memory element 1102A-1102D may be programmed to function as a synchronous or asynchronous flip-flop or latch. The selection between synchronous and asynchronous functionality is made for all four memory elements in a slice by programming Sync/Asynch selection circuit 903. When a memory element is programmed so that the S/R (set/reset) input signal provides a set function, the REV input terminal provides the reset function. When the memory element is programmed so that the S/R input signal provides a reset function, the REV input terminal provides the set function. Memory elements 1102A-1102D are clocked by a clock signal CK, which may be provided by a global clock network or by the interconnect structure, for example. Such programmable memory elements are well known in the art of FPGA design. Each memory element 1102A-1102D provides a registered output signal AQ-DQ to the interconnect structure. Because each LUT 1101A-1101D provides two output signals, O5 and O6, the LUT may be configured to function as two 5-input LUTs with five shared input signals (IN1-IN5), or as one 6-input LUT having input signals IN1-IN6.

In the embodiment of FIG. 11, each LUTM 1101A-1101D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 1117A-1117C for LUTs 1101A-1101C), or to the two 32-bit RAMs via input terminals DI1 and DI2. RAM write operations in the LUT RAMs are controlled by clock signal CK from multiplexer 1106 and by write enable signal WEN from multiplexer 1107, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 1101A may also be provided to the general interconnect structure for shift register chaining, via output select multiplexer 1111D and CLE output terminal DMUX. Accordingly, the circuits and methods set forth above may be implemented in a device such as the devices of FIGS. 10 and 11, or any other suitable device.

Figure 12:
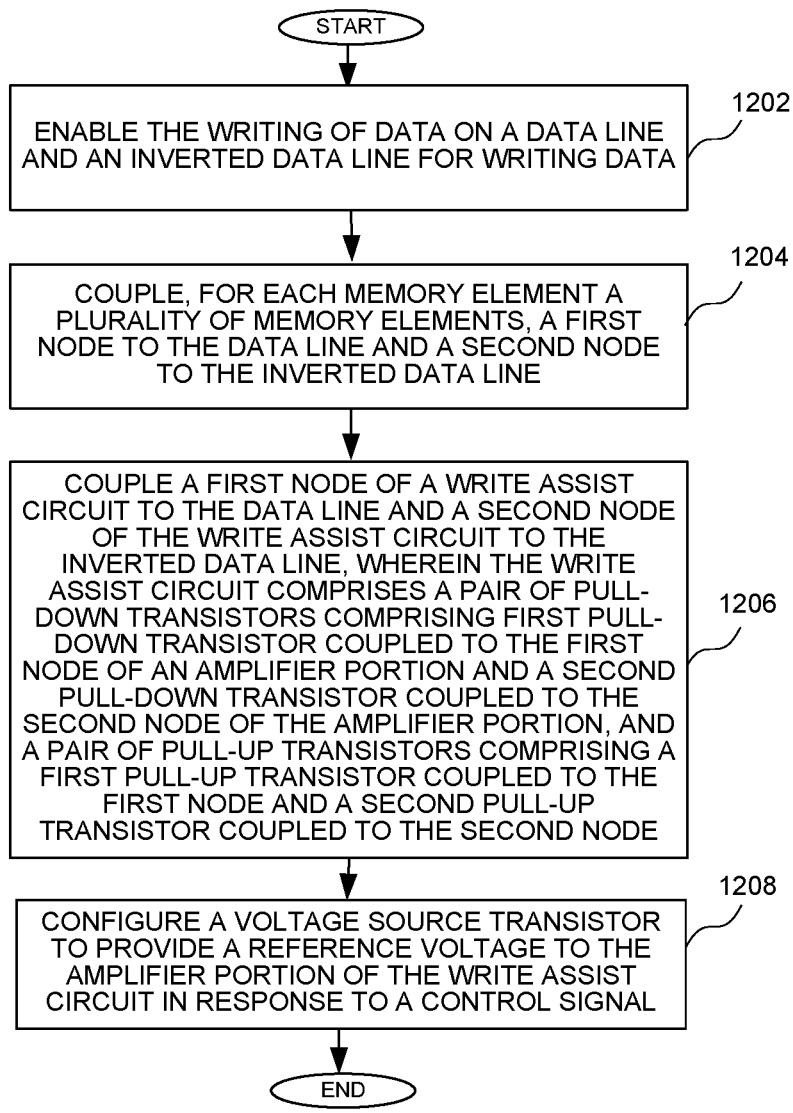
FIG. 12 is a flow chart showing a method of enabling the write operation of a memory.

Turning now to FIG. 12, a flow chart shows a method of a write operation of a memory. The writing of data on a data line and an inverted data line is enabled at a block 1202. A first node of the write assist circuit is coupled to the data line and a second node of the write assist circuit is coupled to the inverted data line, for each memory element a plurality of memory elements, at a block 1204. A write assist circuit is coupled to the plurality of memory blocks at a block 1206. The write assist circuit may comprise a pair of pull-down transistors comprising first pull-down transistor coupled to the first node of the amplifier portion and a second pull-down transistor coupled to a second node of the amplifier portion, and a pair of pull-up transistors comprising a first pull-up transistor coupled to the first node and a second pull-up transistor coupled to the second node. A voltage source transistor is configured to provide a reference voltage to an amplifier portion of the write assist circuit in response to a control signal at a block 1208.

According to other implementations, a first enable transistor may be coupled to a first pull-down node and a second enable transistor may be coupled to the second pull-down node. The method may further comprise configuring a plurality of memory cells are SRAM cells. A plurality of write assist circuits may also be implemented, wherein each write assist circuit is configured between predetermined memory elements of the plurality of memory elements. According to some implementations, the plurality of memory elements may be implemented as configuration memory elements, wherein data stored in the configuration memory configures a plurality of configurable logic elements. The method of FIG. 12 may be implemented according to the various circuits of FIGS. 1-11 as described, or other suitable circuits.

It can therefore be appreciated that circuits for and methods of implementing a write operation have been described. It will be appreciated by those skilled in the art that numerous alternatives and equivalents will be seen to exist that incorporate the disclosed invention. As a result, the invention is not to be limited by the foregoing embodiments, but only by the following claims.

We claim:

1. A circuit for implementing a write operation of a memory, the circuit comprising:
   a data line buffer coupled to a data line and an inverted data line for writing data;
   a plurality of memory elements, each memory element having a first node coupled to the data line and a second node coupled to the inverted data line; and
   a write assist circuit having a first node coupled to data line and a second node coupled to the inverted data line, wherein the write assist circuit comprises a pair of pull-down transistors comprising first pull-down transistor coupled to the first node of an amplifier portion and a second pull-down transistor coupled to the second node of the amplifier portion, and a pair of pull-up transistors comprising a first pull-up transistor coupled to the first node of the amplifier portion and a second pull-up transistor coupled to the second node of the amplifier portion.

2. The circuit of claim 1 further comprising a voltage source transistor configured to provide a reference voltage to the amplifier portion of the write assist circuit in response to a control signal.

3. The circuit of claim 1 further comprising a first enable transistor coupled to a first pull-down node and a second enable transistor coupled to a second pull-down node.

4. The circuit of claim 1 wherein the plurality of memory elements comprises a plurality of SRAM cells.

5. The circuit of claim 1 further comprising a plurality of write assist circuits, wherein each write assist circuit is associated with a memory element of the plurality of memory elements.

6. The circuit of claim 1 wherein the plurality of memory elements comprises configuration memory elements.

7. The circuit of claim 6 further comprising a plurality of configurable logic elements, wherein data stored in the configuration memory element configures the plurality of configurable logic elements.

8. A circuit for implementing a write operation of a memory, the circuit comprising:
- a data line buffer coupled to a data line and an inverted data line for writing data;
- a plurality of memory elements, each memory element having a first node coupled to the data line and a second node coupled to the inverted data line; and
- a write assist circuit having a first node of an amplifier portion coupled to data line and a second node of the amplifier portion coupled to the inverted data line, wherein the write assist circuit comprises a voltage source transistor configured to provide a reference voltage to the amplifier portion of the write assist circuit in response to a control signal.

9. The circuit of claim 8 further comprising a first enable transistor coupled to a first pull-down node and a second enable transistor coupled to a second pull-down node.

10. The circuit of claim 8 wherein the plurality of memory elements comprises a plurality of SRAM cells.

11. The circuit of claim 8 further comprising a plurality of write assist circuits, wherein each write assist circuit is associated with a memory element of the plurality of memory elements.

12. The circuit of claim 8 wherein the plurality of memory elements comprises configuration memory elements.

13. The circuit of claim 12 further comprising a plurality of configuration logic elements, wherein data stored in the configuration memory elements configures the plurality of configurable logic elements.

14. A method of implementing a write operation of a memory, the method comprising:
- enabling the writing of data on a data line and an inverted data line;
- coupling, for each memory element of a plurality of memory elements, a first node to the data line and a second node to the inverted data line; and
- coupling a first node of an amplifier portion of a write assist circuit to the data line and a second node of the write assist circuit to the inverted data line, wherein the write assist circuit comprises a pair of pull-down transistors comprising first pull-down transistor coupled to the first node of the amplifier portion and a second pull-down transistor coupled to the second node of the amplifier portion, and a pair of pull-up transistors comprising a first pull-up transistor coupled to the first node of the amplifier portion and a second pull-up transistor coupled to the second node of the amplifier portion.

15. The method of claim 14 further comprising configuring a voltage source transistor to provide a reference voltage to the amplifier portion of the write assist circuit in response to a control signal.

16. The method of claim 14 further comprising coupling a first enable transistor to a first pull-down node and coupling a second enable transistor to a second pull-down node.

17. The method of claim 14 wherein configuring a plurality of memory elements comprises configuring a plurality of SRAM cells.

18. The method of claim 14 further comprising configuring a plurality of write assist circuits, wherein each write assist circuit is associated with a memory element of the plurality of memory elements.

19. The method of claim 14 wherein configuring a plurality of memory elements comprises implementing configuration memory elements.

20. The method of claim 19 further comprising implementing a plurality of configuration logic elements, wherein data stored in the configuration memory elements configures the plurality of configurable logic elements.

* * * * *